United States Patent
Aiso

(10) Patent No.: US 9,319,016 B2
(45) Date of Patent: Apr. 19, 2016

(54) LEVEL ADJUSTMENT DEVICE

(75) Inventor: Masaru Aiso, Hamamatsu-Shi (JP)

(73) Assignee: Yamaha Corporation, Hamamatsu-shi (JP)

( * ) Notice: Subject to any disclaimer, the term of this patent is extended or adjusted under 35 U.S.C. 154(b) by 367 days.

(21) Appl. No.: 13/050,862

(22) Filed: Mar. 17, 2011

(65) Prior Publication Data

US 2012/0039488 A1 Feb. 16, 2012

(30) Foreign Application Priority Data

Mar. 24, 2010 (JP) ................................. 2010-067328
Mar. 24, 2010 (JP) ................................. 2010-067330

(51) Int. Cl.
| | | |
|---|---|---|
| H03G 3/00 | (2006.01) | |
| H03G 3/30 | (2006.01) | |
| H03G 1/00 | (2006.01) | |
| H03G 3/02 | (2006.01) | |
| H03F 1/02 | (2006.01) | |

(52) U.S. Cl.
CPC ........... *H03G 3/3026* (2013.01); *H03G 1/0088* (2013.01); *H03G 3/02* (2013.01); *H03G 3/301* (2013.01); *H03F 1/0261* (2013.01); *H03F 2203/7203* (2013.01)

(58) Field of Classification Search
CPC ..... H03G 1/0088; H03G 3/3026; H03G 3/00; H03G 3/3005
USPC .......... 381/104–109, 22, 111, 119–120, 94.5, 381/94.8, 94.2; 327/306; 330/129, 254, 330/278; 700/74
See application file for complete search history.

(56) References Cited

U.S. PATENT DOCUMENTS

| | | | | |
|---|---|---|---|---|
| 6,836,184 B1 * | 12/2004 | Daughtry | ............. | H03G 3/3042 330/144 |
| 7,672,359 B2 * | 3/2010 | Cleary | ................. | H03G 3/3078 375/147 |
| 7,868,681 B2 * | 1/2011 | van der Wagt | ....... | H03G 1/0088 327/308 |

FOREIGN PATENT DOCUMENTS

| | | | | |
|---|---|---|---|---|
| GB | 2389006 B | * | 9/2004 | ........... H03G 3/3052 |
| JP | 2005151250 A | * | 6/2005 | ............... H03G 3/20 |
| KR | 2001002515 | * | 1/2001 | ............. H04B 7/155 |
| WO | WO 87/06404 | * | 10/1987 | ............... H03G 3/08 |
| WO | WO-8706404 | * | 10/1987 | ............... H03G 3/08 |
| WO | WO 8706404 A1 | * | 10/1987 | ............... H03G 3/08 |

* cited by examiner

*Primary Examiner* — Davetta W Goins
*Assistant Examiner* — Oyesola C Ojo
(74) *Attorney, Agent, or Firm* — Morrison & Foerster LLP

(57) ABSTRACT

It is possible to enable automatic on/off switching of a pad and to prevent frequent occurrence of on/off switching of a pad even when a user carries out fine manipulation. A level adjustment device includes a pad which attenuates a signal by a predetermined level, an amplifier which is provided at the back of the pad to adjust the level of the signal with a variable amplification rate or attenuation rate, and a level adjustment unit which, when the pad is off, uses only the amplifier and, when the pad is on, uses the amplifier and the pad to adjust the level of the acoustic signal. The setting of a level adjustment value by the level adjustment unit is received, when the level adjustment value reaches a predetermined switching point Tsw, the on/off of the pad is switched, and when an instruction is issued to start a performance mode, the value of the switching point Tsw is changed so as to be away from the level adjustment value at the point of time of the instruction.

10 Claims, 8 Drawing Sheets

BLOCK DIAGRAM SHOWING OVERALL CONFIGURATION OF DIGITAL MIXER

EXTERNAL APPARATUS    20 ⋯ SYSTEM BUS

BLOCK DIAGRAM SHOWING CONFIGURATION OF DSP

DIAGRAM SHOWING CONFIGURATION OF WAVEFORM I/O

70···ANALOG INPUT TERMINAL
71···PAD-SWITCHING SWITCH
72···PAD
73···AMPLIFIER
74···ANALOG-TO-DIGITAL CONVERTER
75···MUTE SWITCH
76···PHASE INVERTER
77···HIGH-PASS FILTER

EXPLANATORY VIEW OF SETTABLE RANGE OF LEVEL ADJUSTMENT VALUE

EXPLANATORY VIEW OF SWITCHING CONDITION OF PAD ON/OFF (FIRST EMBODIMENT)

PROCESSING FOR CHANGING LEVEL ADJUSTMENT VALUE (FIRST EMBODIMENT)

PAD ON/OFF SWITCHING PROCESSING

PROCESSING FOR CHANGING OPERATION MODE (FIRST EMBODIMENT)

EXPLANATORY VIEW OF SWITCHING CONDITION OF PAD ON/OFF
(SECOND EMBODIMENT)

PROCESSING FOR CHANGING LEVEL ADJUSTMENT VALUE (SECOND EMBODIMENT)

EXPLANATORY VIEW OF CONTROL WHEN PERFORMANCE MODE STARTS
(SECOND EMBODIMENT)

PROCESSING FOR CHANGING OPERATION MODE (SECOND EMBODIMENT)

LEVEL ADJUSTMENT DEVICE

BACKGROUND OF THE INVENTION

1. Field of the Invention

The present invention relates to a level adjustment device which adjusts the level of an acoustic signal and, in particular, to a level adjustment device which is suitable for level adjustment when an analog acoustic signal is input to an acoustic signal processing apparatus, such as a digital mixer.

2. Background Art

In an acoustic signal processing apparatus, such as a digital mixer, an amplifier is provided in an input section of an analog acoustic signal to adjust the gain. The amplifier is configured to adjust the level of an input analog acoustic signal in accordance with a manipulation of a user.

The reason for the adjustment is that an acoustic signal input from an analog input terminal has various amplitude levels depending on what type of apparatus is used as a generation source, and the level balance of the acoustic signal is arranged such that all the amplitude levels are optimally handled in the acoustic signal processing of the acoustic signal processing apparatus.

In realizing the level adjustment function, an attenuator, called a pad, is provided in front of the amplifier to attenuate the amplitude level of the acoustic signal by a fixed value.

With the use of the pad, the range of level adjustment in the level adjustment function can be increased further than an adjustment range which can be realized by only the amplifier.

For example, if the adjustment range of the amplifier is +16 dB (decibel) to +60 dB, and the attenuation amount of the pad is −26 dB, when the pad is off and only the amplifier is used, adjustment can be done from +16 dB to +60 dB. Meanwhile, when the pad is on and the amplifier and the pad are used in combination, adjustment can be done from −10 dB to +34 dB. As a whole, the adjustment range from −10 dB to +60 dB can be obtained.

This level adjustment device is described in, for example, JP-A-2008-263410 (the paragraph 0019 and FIG. 1), "PM5D/PM5D-RHV2/DSP5D Manual", Yamaha Corporation, 2004 (specifically, p. 43), and "DM2000 Version2 Manual", Yamaha Corporation, 2004 (specifically, p. 64)

However, in manipulating the above-described level adjustment device including the pad and the amplifier, in "PM5D/PM5D-RHV2/DSP5D Manual" and "DM2000 Version2 Manual", the user manually manipulates the on/off of the pad. In this case, in performing level adjustment, two types of manipulation including the setting of the amplifier gain and the setting of pad on/off are necessary. Thus, there is a problem in that it takes a lot of effort to carry out the manipulation.

In order to solve this problem, a configuration is considered in which a switching point is provided such that the on/off of the pad is automatically switched. That is, a configuration is considered in which, when the level adjustment value received from the user is greater than the switching point, the pad is off and level adjustment is performed by only the amplifier, and when the level adjustment value is smaller than the switching point, the pad is on and then the pad and the amplifier are used in combination to perform level adjustment. In general, in switching the on/off of the pad, noise is generated, the acoustic signal becomes mute.

On the other hand, in the level adjustment device, level adjustment may be performed such that the level adjustment value is raised and falls finely within a limited range. In the above-described configuration in which the switching point is provided, if such level adjustment is performed, when level adjustment which raises and falls the level adjustment value finely is performed near the switching point, the on/off of the pad is switched each time the level adjustment value passes through the switching point. Accordingly, there is a problem in that mute is frequently generated, and the acoustic signal is frequently discontinued, causing an undesirable state.

SUMMARY OF THE INVENTION

The invention has been finalized in consideration of the above-described situation, and an object of the invention is to enable automatic on/off switching of a pad and to prevent frequent occurrence of on/off switching of the pad even when a user carries out fine manipulation.

In order to achieve the above-described object, the invention provides a level adjustment device. The level adjustment device includes a pad which attenuates the level of an acoustic signal in accordance with a fixed attenuation rate, an amplifier which amplifies or attenuates the level of the acoustic signal in accordance with a variable amplification rate or attenuation rate, a level adjustment unit which includes the pad and the amplifier and, when the pad is off, uses only the amplifier and, when the pad is on, uses the amplifier and the pad to adjust the level of the acoustic signal, a receiving unit which receives a level adjustment value, the level adjustment unit adjusting the level of the acoustic signal on the basis of the level adjustment value, a storage unit which stores one value within a settable range of the level adjustment value as a switching point, a switching unit which, when the level adjustment value received by the receiving unit reaches the switching point, switches the on/off of the pad, a mode switching unit which issues an instruction to start a performance mode, and a change unit which, when an instruction is issued to start the performance mode in the mode switching unit, changes the value of the switching point so as to be away from the level adjustment value at the point of time of the instruction.

According to the above-described level adjustment device of the invention, it is possible to enable automatic on/off switching of the pad to prevent frequent occurrence of on/off switching of the pad even when the user carries out fine manipulation.

DETAILED DESCRIPTION OF THE INVENTION

Hereinafter, embodiments of the invention will be described with reference to the drawings.

[First Embodiment: FIGS. 1 to 9]

Figure 1:
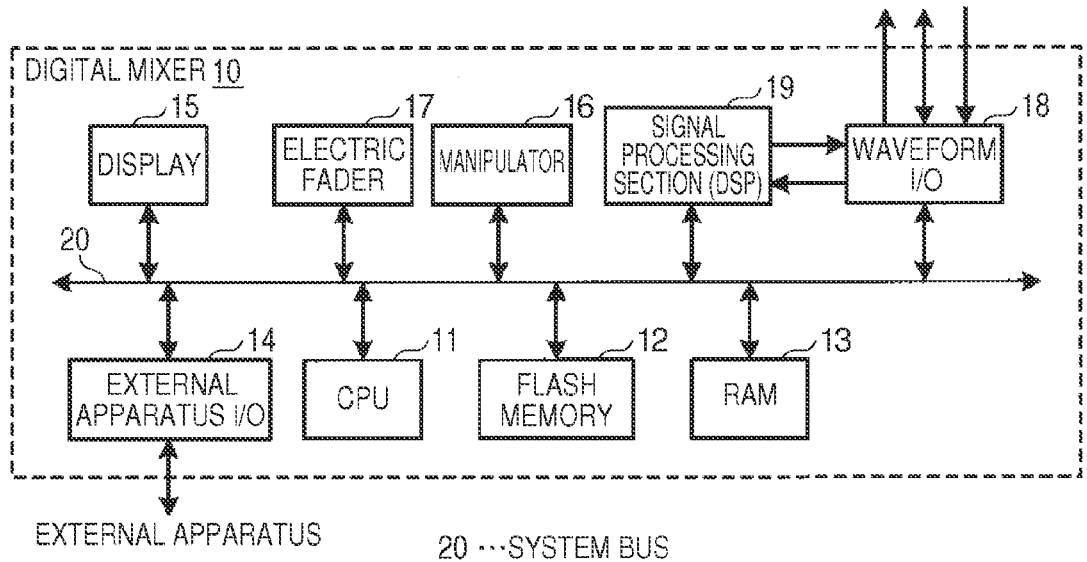
FIG. 1 is a block diagram showing the schematic hardware configuration of a digital mixer of a level adjustment device of the invention.

First, a digital mixer according to a first embodiment of the invention will be described. FIG. 1 is a block diagram showing the schematic hardware configuration of the digital mixer.

As shown in FIG. 1, a digital mixer 10 includes a CPU 11, a flash memory 12, a RAM 13, an external apparatus input/output section (I/O) 14, a display 15, a manipulator 16, an electric fader 17, a waveform I/O 18, and a signal processing section (DSP) 19, which are connected to each other through a system bus 20. The digital mixer operates as an acoustic signal processing apparatus which has a function of performing signal processing, such as mixing or equalizing, for a plurality of input acoustic signals and outputting the acoustic signal after the signal processing. The digital mixer also has a function as a level adjustment device which adjusts the level of the input analog acoustic signal. In this specification, the term "level" means the amplitude level of the acoustic signal.

The CPU 11 is a control unit which performs the overall operation of the digital mixer 10, and executes a necessary program stored in the flash memory 12 to perform processing, such as input/output of data and acoustic signals in the external apparatus I/O 14 and the waveform I/O 18, display control in the display 15, and detection of manipulation of the manipulator 16 or the electric fader 17 and setting/change of the values of various processing parameters or control of the respective sections in the digital mixer 10 according to the manipulation.

The flash memory 12 is a rewritable nonvolatile storage unit which stores a control program to be executed by the CPU 11. The RAM 13 is a volatile storage unit which stores data to be temporarily stored or is used as a work memory of the CPU 11.

The external apparatus I/O 14 is an interface to which various external apparatuses are connected to perform input/output. For example, interfaces are prepared to which an external display, a mouse, a keyboard for character input, a manipulation panel, and the like are connected.

The display 15 is a display unit which displays various kinds of information under the control of the CPU 11, and may be constituted by, for example, a liquid crystal panel (LCD) or a light-emitting diode (LED).

The manipulator 16 receives manipulation with respect to the digital mixer 10, and may be constituted by various keys, buttons, rotary encoders, sliders, and the like. A touch panel may be used which is laminated on the LCD serving as the display 15.

The electric fader 17 is a slider manipulator which mainly sets a fader level in an acoustic signal processing routine channel (ch), and includes a driving unit which moves a knob to an arbitrary position under the control of the CPU 11.

The waveform I/O 18 is an interface which receives the input of acoustic signals to be processed by the DSP 19 and outputs acoustic signals after processing. The waveform I/O 18 has a plurality of analog input terminals, a plurality of analog output terminals, a plurality of digital input/output terminals, and the like, and performs the input/output of acoustic signals through the terminals.

The DSP 19 is constituted by a digital signal processing circuit, and has a mixing function of performing signal processing, such as mixing or equalizing, for acoustic signals input from the waveform I/O 18 and outputting acoustic signals after signal processing again to the waveform I/O 18. This signal processing is controlled by the current values (current data) of various processing parameters. Current data is set by manipulation of the manipulator 16 and recorded in the RAM 13 or a current memory in the DSP 19.

Figure 2:
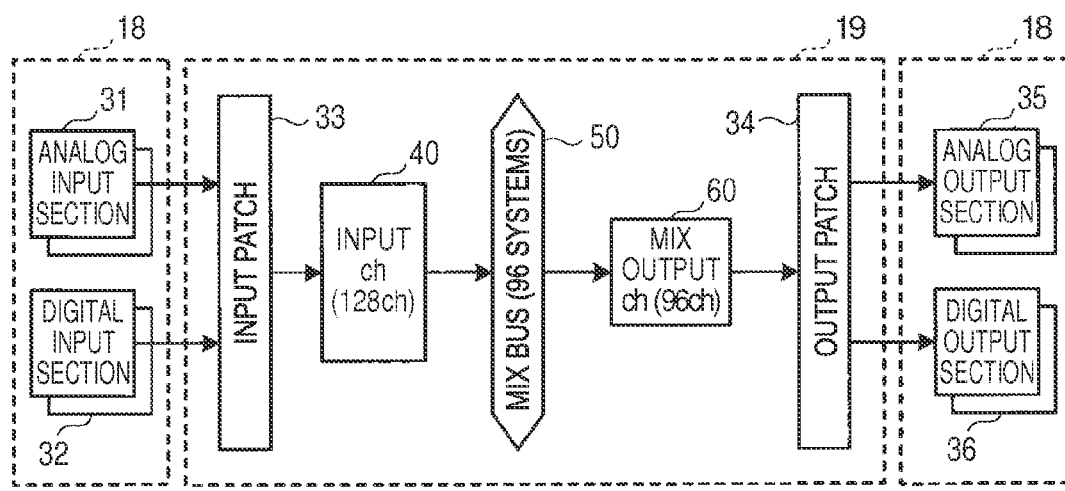
FIG. 2 is a block diagram showing the configuration of signal processing in a DSP 19 of FIG. 1 in detail.

Next, the configuration of signal processing which is performed by the DSP 19 of FIG. 1 is shown in FIG. 2 in detail. As shown in FIG. 2, the signal processing in the DSP 19 has an input patch 33, an input ch 40, mixing (MIX) buses 50, a MIX output ch 60, and an output patch 34.

In the input patch 33, one of a plurality of analog input sections 31 and a plurality of digital input sections 32 which are provided to correspond to the input terminals of the waveform I/O 18 is patched (allocated) to each input ch 40 having 128 ch. In each input ch, signal processing, such as an attenuator or an equalizer, is Performed for an acoustic signal input from the patched input section, and the acoustic signal after signal processing is sent to one or a plurality of MIX buses 50 from among the 96-system MIX buses 50. At the time of sending the acoustic signal, the level of the acoustic signal to be sent can be arbitrarily changed for each MIX bus 50.

Each MIX bus 50 mixes the acoustic signals input from the input ch 40 and sends the acoustic signal after mixing to the 96-ch MIX output ch 60 provided for each system of the MIX bus 50.

Each MIX output ch 60 performs signal processing, such as an equalizer or a compressor, for the acoustic signal input from the MIX bus 50 and sends the acoustic signal after signal processing to the output patch 34. In the output patch 34, one of a plurality of analog output sections 35 and a plurality of digital output sections 36 which are provided to correspond to the output terminals of the waveform I/O 18 is patched to each MIX output ch 60, and the acoustic signal of each MIX output ch is output from the output section before the patch.

Figure 3:
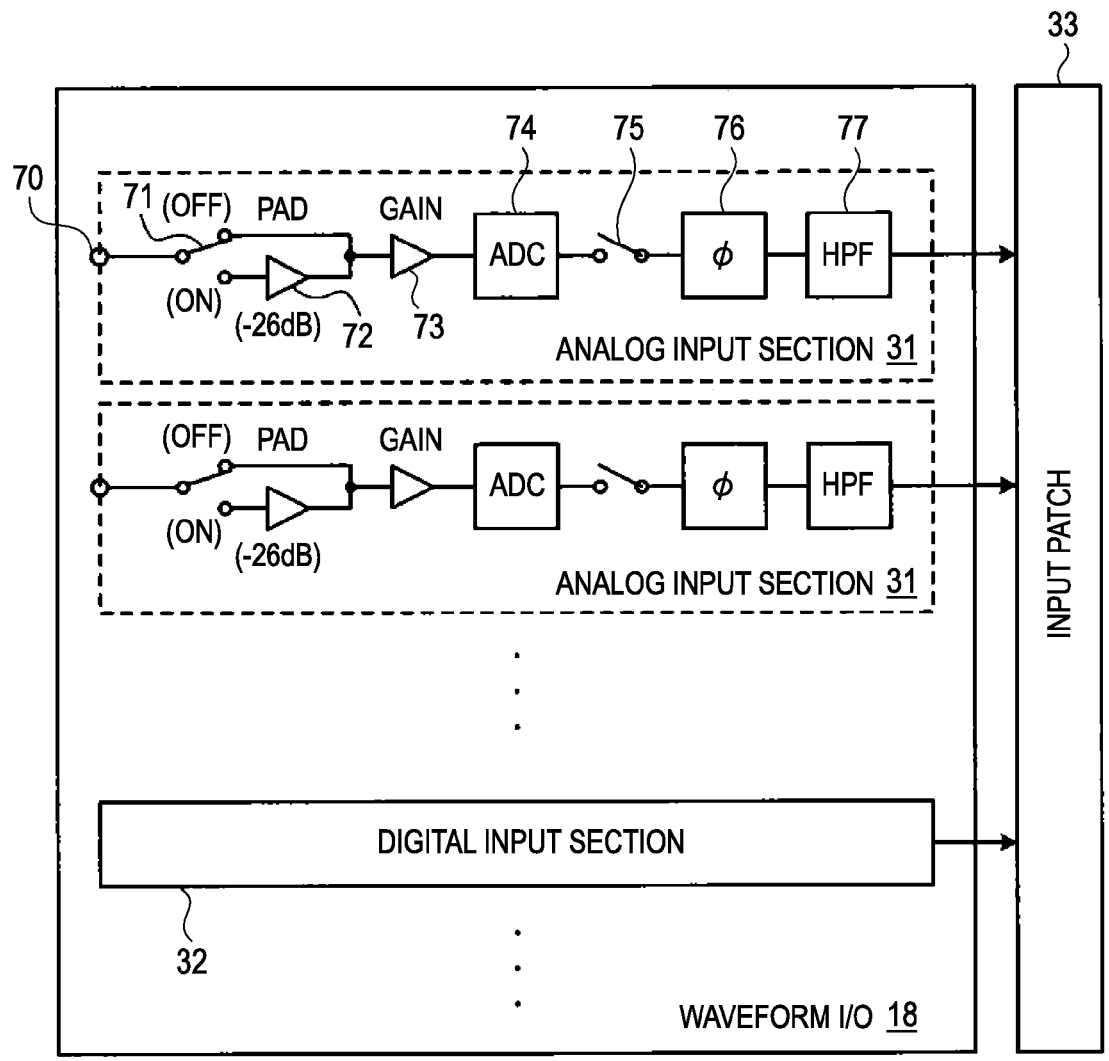
FIG. 3 is a diagram showing the configuration of an analog input section in a waveform I/O of FIG. 2 in more detail.

Next, the configuration of the waveform I/O 18 will be described in detail with reference to FIG. 3. FIG. 3 mainly shows the configuration of the analog input section 31 related to the feature portion of the invention.

In the waveform I/O 18, the analog input sections 31 are provided to correspond to analog input terminals 70 for inputting the analog acoustic signals. Each analog input section 31 includes a pad-switching switch 71, a pad 72, an amplifier 73, an analog-to-digital converter (ADC) 74, a mute switch 75, a phase inverter 76, and a high-pass filter 77.

In the pad-switching switch 71, the pad 72, and the amplifier 73 before the ADC 74, analog signal processing is performed. In the mute switch 75, the phase inverter 76, and the high-pass filter 77 after the ADC 74, digital signal processing is performed. Current data of various processing parameters (level adjustment value, pad on/off, variable gain value, mute on/off, and the like described below) for controlling the constituent elements is stored in the current memory.

The pad 72 is a constituent element which attenuates the level of the acoustic signal in accordance with a fixed attenuation rate (fixed gain value). The pad-switching switch 71 is a constituent element which switches a state (pad-on) where the pad 72 is used for the acoustic signal and a state (pad-off) where the pad is not used, that is, switches the on/off of the pad. When the pad-switching switch 71 is on (pad-on), the analog acoustic signal input from the analog input terminal 70 is subjected to level attenuation according to the fixed gain value in the pad 72 and then sent to the amplifier 73. Meanwhile, when the pad-switching switch 71 is off (pad-off), the acoustic signal is not subjected to attenuation in the pad 72 and is sent to the amplifier 73 with the level at the time of the input.

The amplification rate or attenuation rate in the amplifier 73 is variable. The amplifier 73 is a constituent element which amplifies or attenuates the level of the input analog acoustic signal in accordance with a set amplification rate or attenuation rate (variable gain value) and sends the analog acoustic signal after amplification or attenuation to the ADC.

The level of the analog acoustic signal is adjusted through the processing in the pad-switching switch 71 to the amplifier 73. This processing corresponds to a level adjustment function. In the level adjustment function, level adjustment corresponding to a level adjustment value (so-called HA (head amplifier) gain value) designated by the user is realized by using the fixed gain value of the pad 72 and the variable gain value of the amplifier 73.

In general, level adjustment of the analog acoustic signal includes adjustment through the analog signal processing before the ADC and fine adjustment through the digital signal processing after the ADC. The processing in the pad-switching switch 71 to the amplifier 73 corresponds to the adjustment through the analog signal processing before the ADC. In this example, for simplification of description, description of the digital signal processing after the ADC will be omitted.

The ADC 74 converts the analog acoustic signal after level adjustment by the level adjustment function to a digital acoustic signal. The digital acoustic signal after conversion is subjected to signal processing in the phase inverter 76 and the high-pass filter 77 and then sent to the input patch 33. When the acoustic signal is mute (when the mute switch 75 is off), the signal processing in the phase inverter 76 and the high-pass filter 77 and the sending to the input patch 33 are not performed.

In this specification, the term "mute" refers to control such that an acoustic signal input to an input terminal is not substantially sent to the input patch 33, and is mainly used to switch the on/off of the pad. As shown in FIG. 3, in addition to the configuration in which mute is realized by using the on/off of the mute switch 75, a configuration is made in which the level of the acoustic signal is set to −∞ dB to realize mute.

Figure 4:
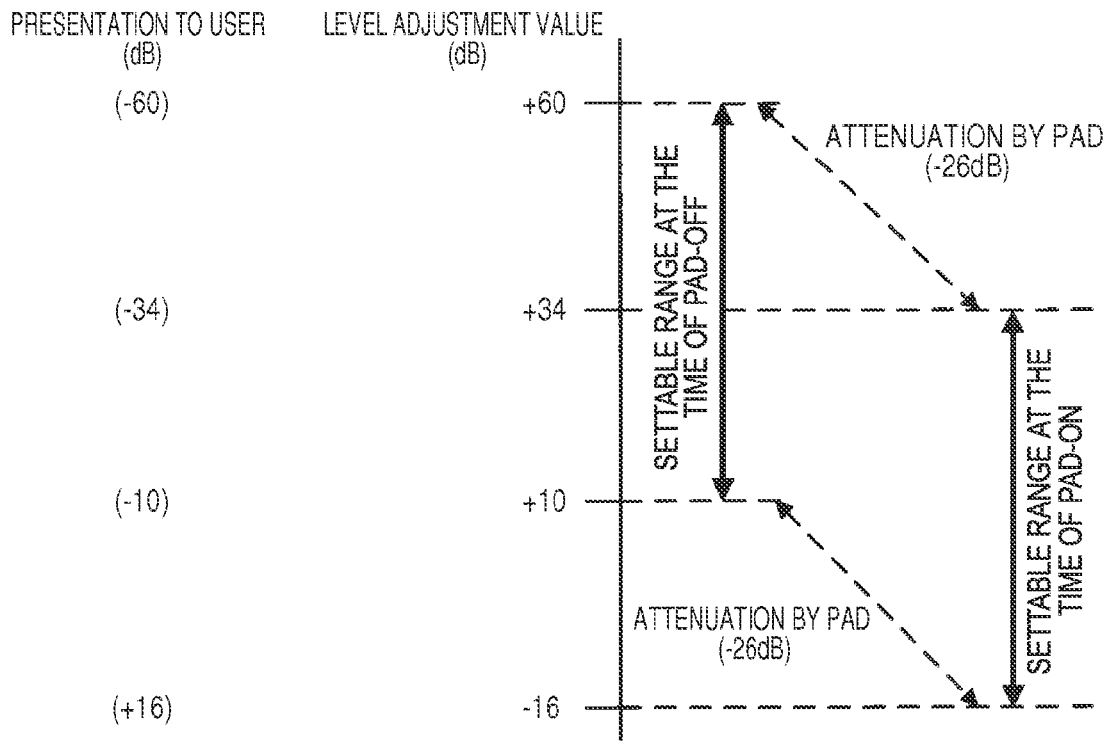
FIG. 4 is a diagram illustrating a settable range of a level adjustment value in the analog input section of FIG. 3.

Next, the settable range of the level adjustment value in the analog input section 31 will be described with reference to FIG. 4.

In this example, it is assumed that the variable gain value of the amplifier 73 is variable in the range of +10 dB to +60 dB and the fixed gain value of the pad 72 is fixed at −26 dB.

In the pad-off state, the pad 72 is not used and only the amplifier 73 is used. For this reason, the settable range of the level adjustment value becomes +10 dB to +60 dB which is the settable range of the variable gain value of the amplifier 73. In the pad-on state, since the amplifier 73 and the pad 72 are used together, the settable range of the level adjustment value becomes −16 dB to +34 dB which is obtained by adding the fixed gain value of the pad 72 to the settable range of the variable gain value of the amplifier 73 (by attenuating the settable range of the variable gain value of the amplifier 73 by the fixed gain value of the pad 72). Thus, the settable range of the level adjustment value in the analog input section 31 becomes −16 db to +60 dB as a whole.

Next, a pad on/off switching condition will be described with reference to FIG. 5.

The digital mixer 10 has two switching points at which the on/off of the pad is switched. One switching point is an off switching point Toff representing a point at which the pad is switched from off to on, and another switching point is an on switching point Ton representing a point at which the pad is switched from on to off.

It should suffice that Ton and Toff are different values and Ton is greater than Toff.

Ton and Toff are set as a value within a range (in FIG. 5, from +10 dB to +34 dB) which is shared by both the settable range of the level adjustment value at the time of pad-off and the settable range of the level adjustment value at the time of pad-on. It is preferable that Ton and Toff are set to be as sufficiently separated from each other as possible.

Ton and Toff are set as a value for comparison with the level adjustment value, not as the variable gain value of the amplifier 73. Ton and Toff may be arbitrarily set by the user or may have fixed values prepared in advance by the manufacturer.

If the level adjustment value is changed in the pad-off state and reaches Toff, pad-off is switched to pad-on. In the pad-off state, only Toff is used as the switching point, and Ton is not used. Thus, when the changed level adjustment value reaches Ton, pad on/off is not switched.

If the level adjustment value is changed in the pad-on state and reaches Ton, pad-on is switched to pad-off. In the pad-on state, only Ton is used as the switching point, and Toff is not used. Thus, when the changed level adjustment value reaches Toff, pad on/off is not switched.

Figure 5:
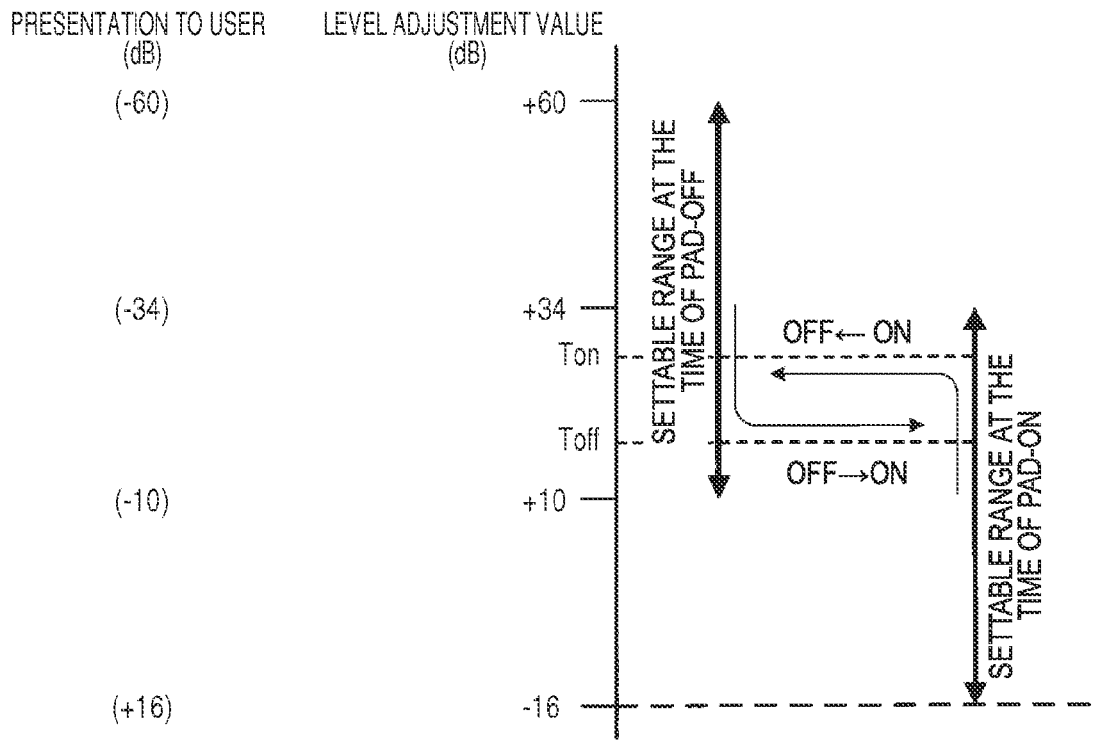
FIG. 5 is a diagram illustrating a pad on/off switching condition in a first embodiment.

Specific description will be provided as to on/off switching assuming that, in FIG. 5, Ton is +30 dB and Toff is +15 dB.

If the level adjustment value is raised from +29 dB to +30 dB in the pad-on state, the level adjustment value reaches Ton (+30 dB), such that pad-on is switched to pad-off. Thereafter, since the pad-off state is reached and Ton is not used, even when level adjustment value falls from +30 dB to +29 dB and is again raised to +30 dB, the pad on/off state is not switched.

If the level adjustment value falls from +16 dB to +15 dB in the pad-off state, the level adjustment value reaches Toff (+15 dB), such that pad-off is switched to pad-on. Thereafter, since the pad-on state is reached and Toff is not used, even when the level adjustment value is raised from +15 dB to +16 dB and again falls to +15 dB, the pad on/off state is not switched.

As understood from the above, according to the invention, even when adjustment is done to raise and fall the level adjustment value frequently near the switching point, there is no case where pad on/off switching frequently occurs. That is, it is possible to inhibit frequent occurrence of mute according to pad on/off switching.

Figure 6:
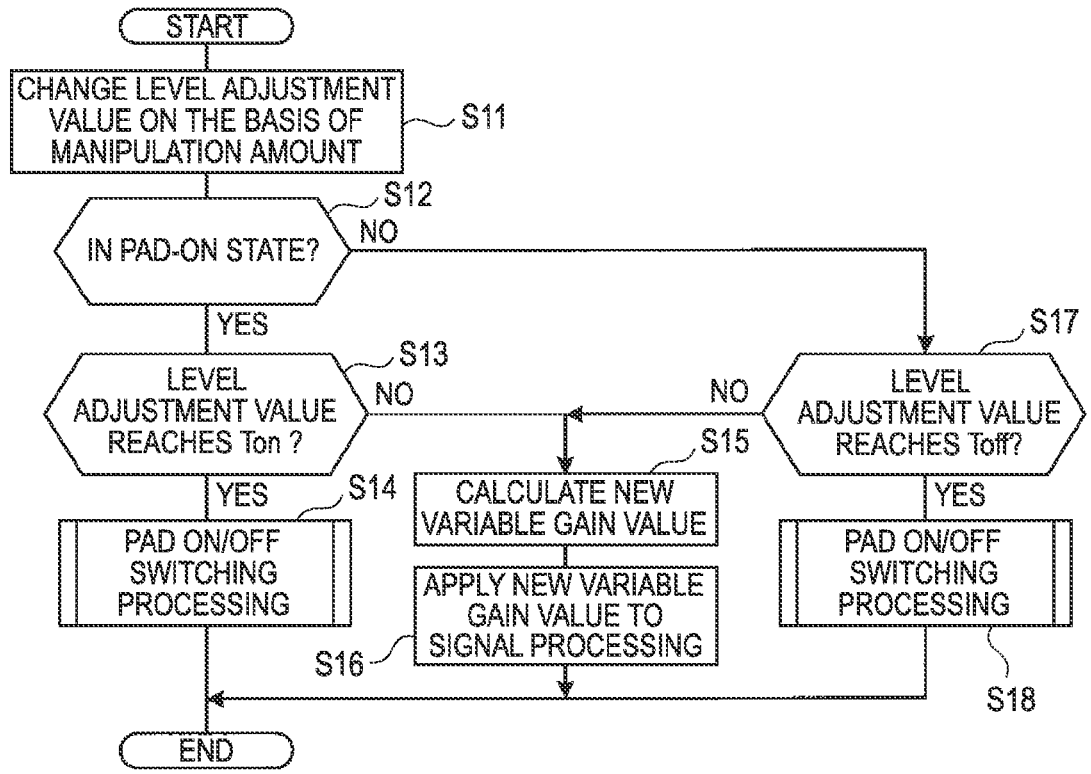
FIG. 6 is a flowchart of processing in the first embodiment which is performed when a CPU of a digital mixer detects manipulation of a level adjustment knob.
Figure 7:
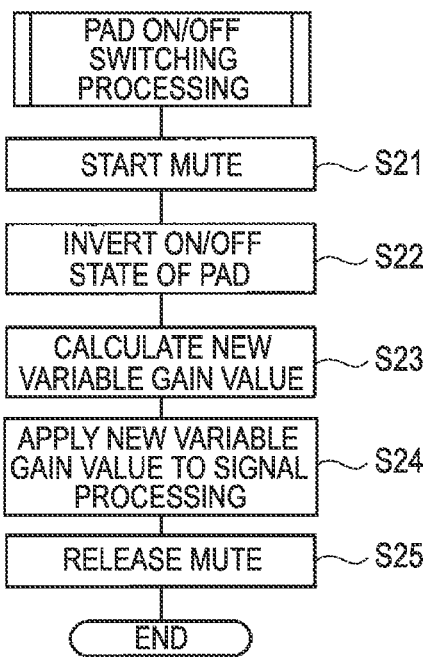
FIG. 7 is a flowchart of pad on/off switching processing which is performed by the CPU of the digital mixer.

FIGS. 6 and 7 are flowcharts of processing which is performed by the CPU 11 to carry out the operation described with reference to FIG. 5.

FIG. 6 shows processing which starts when an instruction is issued to change the level adjustment value, that is, manipulation of the level adjustment knob is detected.

The level adjustment knob is provided for each analog input section 31 as a portion of the manipulator 16. In each step of FIG. 6, a processing target is a single analog input section 31 corresponding to one level adjustment knob whose manipulation is detected, and various processing parameters (level adjustment value, pad on/off, variable gain value, mute on/off, and the like) in the analog input section 31 as the processing target are controlled.

The CPU 11 first changes current data of the level adjustment value on the basis of a detected manipulation amount (Step S11).

Next, the pad on/off state (the on/off state of the pad-switching switch 71) is confirmed with reference to current data of pad on/off. If it is the pad-on state (YES in Step S12), it is determined whether or not current data of a new level adjustment value after change in Step S11 reaches the switching point Ton for pad-on (Step S13). When it is determined that Ton is reached (YES in Step S13), pad on/off switching processing shown in FIG. 7 is performed to set pad-off and to change the variable gain value in response to pad-off (Step S14). After the processing of FIG. 7 ends, the processing of FIG. 6 ends.

In this specification, the fact that the level adjustment value reaches the switching point (Step S13 of FIG. 6, Step S17 of FIG. 6, and Step S42 of FIG. 11) means that the level adjustment value has the same value as the switching point or that the level adjustment value is changed over the switching point.

Specifically, the fact means that level adjustment value has the same value as Ton, Toff, or Tsw described below, that the level adjustment value is changed from a value greater than Toff to a value smaller than Toff, that the level adjustment value is changed from a value smaller than Ton to a value greater than Ton, that the level adjustment value is changed from a value greater than Tsw to a value smaller than Tsw, or that the level adjustment value is changed from a value smaller than Tsw to a value greater than Tsw.

The processing of FIG. 7 will be described. FIG. 7 is a flowchart showing pad on/off switching processing. In each step, the analog input section 31 as a processing target in the flowchart which calls this processing becomes a processing target in FIG. 7. For example, when the processing is called in Step S14 of FIG. 6, the processing target of FIG. 6 is taken over.

First, the mute switch 75 of the analog input section 31 is off to start mute (Step S21). Thereafter, the on/off of the pad is inverted, that is, current data of pad on/off is rewritten to a value opposite to the current value, and the on/off of the pad-switching switch 71 is switched to coincide with the rewritten value (Step S22). Next, the variable gain value of the amplifier 73 is calculated on the basis of current data of pad on/off and current data of the level adjustment value (Step S23), and the calculated value is overwritten to current data of the variable gain value and applied to the amplifier 73 (Step S24).

Step S23 is performed as follows. If current data of pad on/off is pad-off, the fixed gain value is not used and current data of the level adjustment value becomes a new variable gain value as it is. If current data of pad on/off is pad-on, a value which is obtained by adding the absolute value of the fixed gain value to current data of the level adjustment value becomes a new variable gain value.

Specifically, for example, if Ton is set to +30 dB and the level adjustment value is raised from +29 dB to +30 dB in the pad-on state, in Step S22, pad-on is inverted to pad-off. Next, in Step S23, pad-off which is current data of pad on/off and +30 dB which is current data of the level adjustment value are referenced, and since it is in the pad-off state, it is determined that the pad is not used. Thus, +30 dB which is current data of the level adjustment value is determined as a new variable gain value.

If Toff is set to +15 dB and the level adjustment value falls from +16 dB to +15 dB in the pad-off state, in Step S22, pad-off is inverted to pad-on. In Step S23, pad-on which is current data of pad on/off and +15 dB which is current data of the level adjustment value are referenced, and since it is in the pad-on state, it is determined that the pad is used. Thus, +41 dB which is obtained by adding the absolute value of the fixed gain value −26 dB to +15 dB which is current data of the level adjustment value is determined as a new variable gain value.

After Step S24, the mute of the analog input section 31 which has started in Step S21 ends (Step S25), and the processing of FIG. 7 ends.

Returning to the description of FIG. 6, when it is determined in Step S13 that Ton is not reached (NO in Step S13), pad on/off is not switched and, in Steps S15 and S16, the variable gain value is changed. In Steps S15 and S16, the processing for changing the variable gain value is the same as in Steps S23 and S24 of FIG. 7, thus description thereof will be omitted. After the variable gain value is changed, the processing of FIG. 6 ends.

When it is determined in Step S12 that it is in the pad-off state (NO in Step S12), it is determined whether or not current data of the new level adjustment value after change in Step S11 reaches the switching point Toff for pad-off (Step S17). When it is determined that Toff is reached (YES in Step S17), the pad on/off switching processing shown in FIG. 7 is performed to set pad-on and to change the variable gain value in response to pad-on (Step S18). After the processing of FIG. 7 ends, the processing of FIG. 6 ends.

When it is determined in Step S17 that Toff is not reached (NO in Step S17), pad on/off is not switched and, in Steps S15 and S16, the variable gain value is changed. After the variable gain value is changed, the processing of FIG. 6 ends.

Next, an operation mode of the pad will be described.

The digital mixer 10 has two modes as the operation mode of the pad. In this example, a performance mode and a rehearsal mode are provided.

For example, when the level adjustment value set at the time of rehearsal is near the switching point, there is a possibility that the on/off state of the pad is switched with subsequent slight level adjustment (at the time of performance). The performance mode is provided so as to avoid such a situation.

When the performance mode starts, if the level adjustment value is near the switching point, the on/off state of the pad is immediately switched. When this happens, it is possible to increase the distance from the level adjustment value to the switching point, eliminating a possibility that the on/off state of the pad is switched with slight level adjustment.

Figure 8:
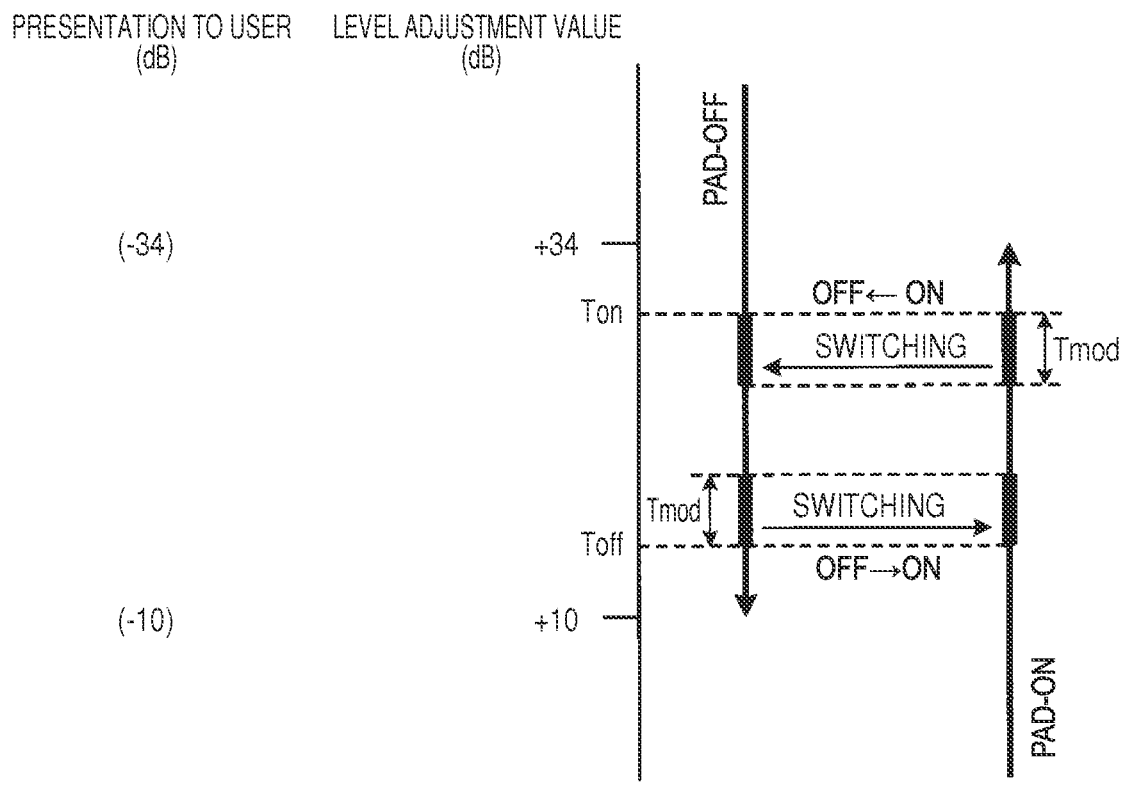
FIG. 8 is a diagram illustrating control in the first embodiment which is performed when a performance mode starts.

Control which is performed when the performance mode starts will be described with reference to FIG. 8.

The digital mixer 10 has a near distance Tmod for determining near the switching point, and regards the range from each switching point to Tmod as a near range. Specifically, as shown in FIG. 8, in the pad-off state, the range from the switching point Toff to a value greater than the switching point Toff by Tmod is set as a near range and, in the pad-on state, the range from the switching point Ton to a value smaller than the switching point Ton by Tmod is set as a near range.

It is determined whether or not current data of the level adjustment value falls within the near range when the performance mode starts. If current data of the level adjustment value falls within the near range, the on/off state of the pad is immediately inverted.

It is appropriate that Tmod is set as a value equal to or smaller than half of the distance from Ton to Toff. This is because, when Tmod is set as a value equal to or greater than half, there is a possibility that, after pad on/off is switched, the level adjustment value is closer to the switching point. A single value of Tmod may be shared by Ton and Toff, or different values of Tmod may be set for Ton and Toff.

Figure 9:
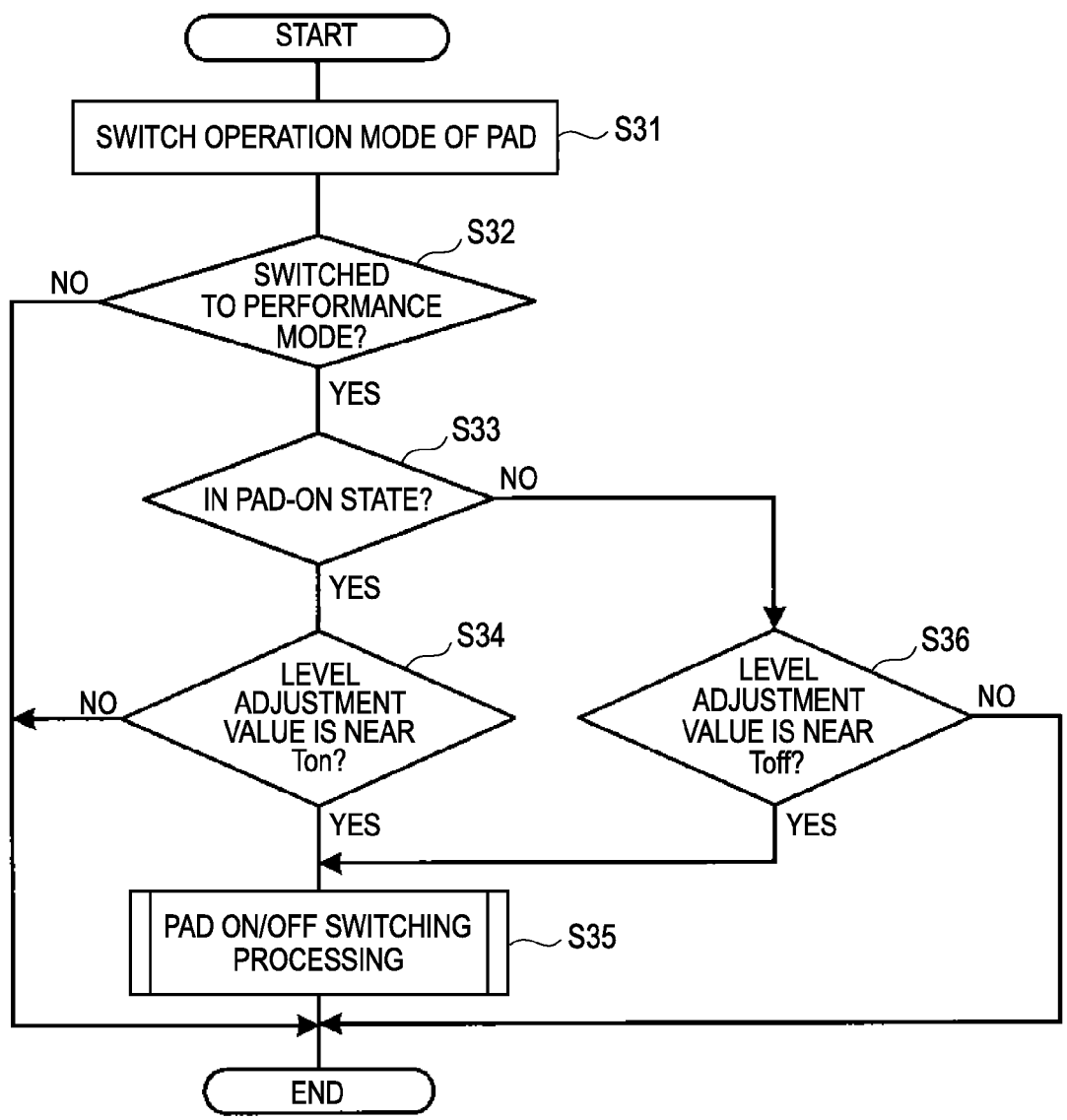
FIG. 9 is a flowchart showing processing in the first embodiment which is performed when the CPU of the digital mixer changes an operation mode.

Next, FIG. 9 is a flowchart of processing which is performed by the CPU 11 to carry out the operation described with reference to FIG. 8. FIG. 9 shows processing which starts when an instruction is issued to switch the operation mode, that is, manipulation of an operation mode-switching switch provided as a portion of the manipulator 16 is detected.

The CPU 11 first inverts the operation mode of the pad (Step S31). Specifically, before manipulation of the operation mode-switching switch, if the operation mode is the performance mode, the operation mode is switched to the rehearsal mode and, if the operation mode is the rehearsal mode, the operation mode is switched to the performance mode. Next, it is confirmed whether or not the operation mode after switching is the performance mode (Step S32). When it is confirmed that the operation mode is the performance mode (YES in Step S32), it is confirmed whether it is currently the pad-on state or not with reference to current data of pad on/off (Step S33).

When it is confirmed that it is currently in the pad-on state (YES in Step S33), it is determined whether or not current data of the level adjustment value is near Ton, that is, whether or not the value of current data of the level adjustment value is within the near range from Ton to Tmod as described with reference to FIG. 8 (Step S34). When it is determined that current data of the level adjustment value is near Ton (YES in Step S34), the pad on/off switching processing shown in FIG. 7 is performed (Step S35) to set pad-off and to change the variable gain value in response to pad-off (Step S35). After the processing of FIG. 7 ends, the processing of FIG. 9 ends.

When it is confirmed in Step S33 that it is not currently in the pad-on state (it is in the pad-off state) (NO in Step S33), it is determined whether or not current data of the level adjustment value is near Toff, that is, whether or not the value of current data of the level adjustment value is within the near range from Toff to Tmod as described with reference to FIG. 8 (Step S36). When it is determined that current data of the level adjustment value is near Toff (YES in Step S36), the pad on/off switching processing shown in FIG. 7 is performed (Step S35) to set pad-on and to change the variable gain value in response to pad-on (Step S35). After the processing of FIG. 7 ends, the processing of FIG. 9 ends.

When it is confirmed in Step S32 that the operation mode is not the performance mode (is the rehearsal mode) (NO in Step S32), when it is determined in Step S34 that current data of the level adjustment value is not near Ton (NO in Step S34), or when it is determined in Step S36 that current data of the level adjustment value is not near Toff, the processing of FIG. 9 immediately ends.

[Second Embodiment: FIGS. 10 to 13]

Next, a second embodiment of the invention will be described. The second embodiment is characterized in that a single pad on/off switching point is provided and, when the performance mode starts, the switching point is moved so as to be away from the level adjustment value. In a digital mixer 10 of the second embodiment, the configuration shown in FIGS. 1 to 4 including the hardware configuration and the like is the same as the digital mixer 10 of the above-described first embodiment, thus description thereof will be omitted.

The condition for switching the on/off of the pad in the second embodiment will be described with reference to FIG. 10.

The digital mixer 10 has a single switching point at which the on/off of the pad is switched. That is, a switching point Tsw is used which is common to the pad-on state and the pad-off state. In the pad-off state, when the level adjustment value is changed and reaches Tsw, pad-off is switched to pad-on. In the pad-on state, when the level adjustment value is changed and reaches Tsw, pad-on is switched to pad-off.

Tsw is set as a value within a range (in FIG. 10, from +10 dB to +34 dB) which is shared by the settable range of the level adjustment value at the time of pad-off and the settable range of the level adjustment value at the time of pad-on. It is preferable that Tsw is set around the center within the settable range. The value of Tsw may be set arbitrarily by the user or may have a fixed value prepared in advance by the manufacturer.

Figure 10:
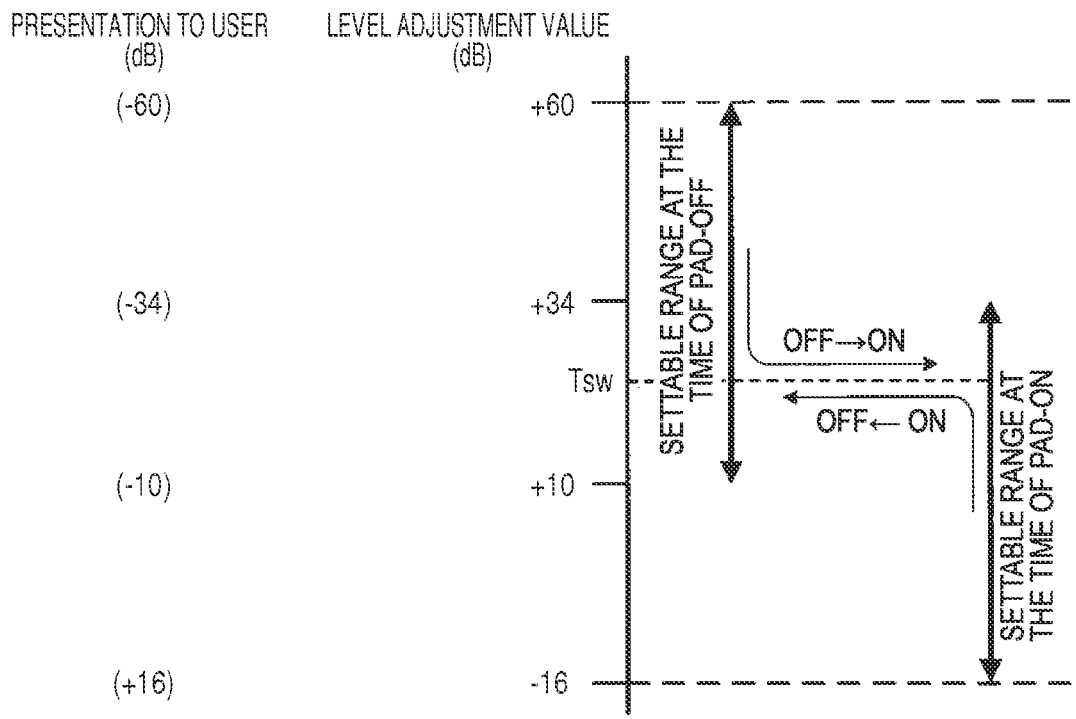
FIG. 10 is a diagram illustrating a pad on/off switching condition in a second embodiment.
Figure 11:
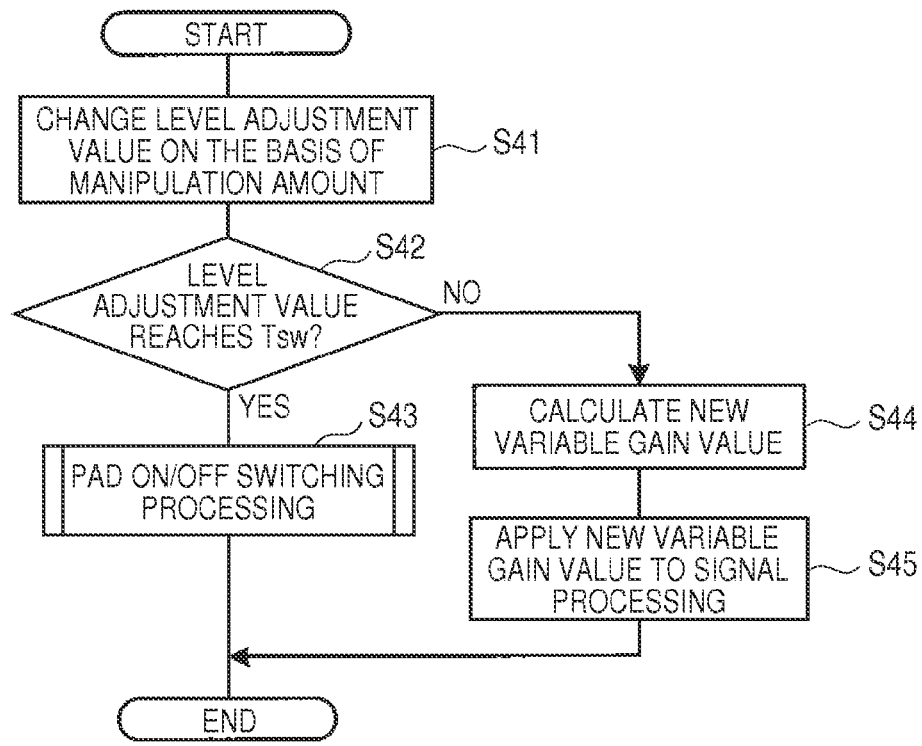
FIG. 11 is a flowchart of processing in the second embodiment which is performed when the CPU of the digital mixer detects manipulation of the level adjustment knob.

FIG. 11 is a flowchart of processing which is performed by the CPU 11 to perform pad on/off switching shown in FIG. 10. Similarly to the processing of FIG. 6, FIG. 11 shows processing which starts when an instruction is issued to change the level adjustment value, that is, when manipulation of the level adjustment knob is detected.

In each step of FIG. 11, a processing target is a single analog input section 31 corresponding to one level adjustment knob whose manipulation is detected, and various processing parameters (level adjustment value, pad on/off, variable gain value, mute on/off, and the like) in the analog input section 31 as the processing target are controlled.

The CPU 11 first changes current data of the level adjustment value on the basis of a detected manipulation amount (Step S41). Next, it is determined whether or not current data of a new level adjustment value after change in Step S41 reaches Tsw (Step S42). When it is determined that current data of the new level adjustment value reaches Tsw (YES in Step S42), the pad on/off switching processing shown in FIG. 7 is performed to invert the setting of pad on/off and to change the variable gain value in response to the new setting of pad on/off (Step S43). After the processing of FIG. 7 ends, the processing of FIG. 11 ends.

When it is determined in Step S42 that current data of the new level adjustment value does not reach Tsw (NO in Step S42), pad on/off is not switched and, in Steps S44 and S45, the variable gain value is changed. The processing for changing the variable gain value in Steps S44 and S45 is the same as in Steps S23 and S24 of FIG. 7, thus description thereof will be omitted. After the variable gain value is changed, the processing of FIG. 11 ends.

Figure 12:
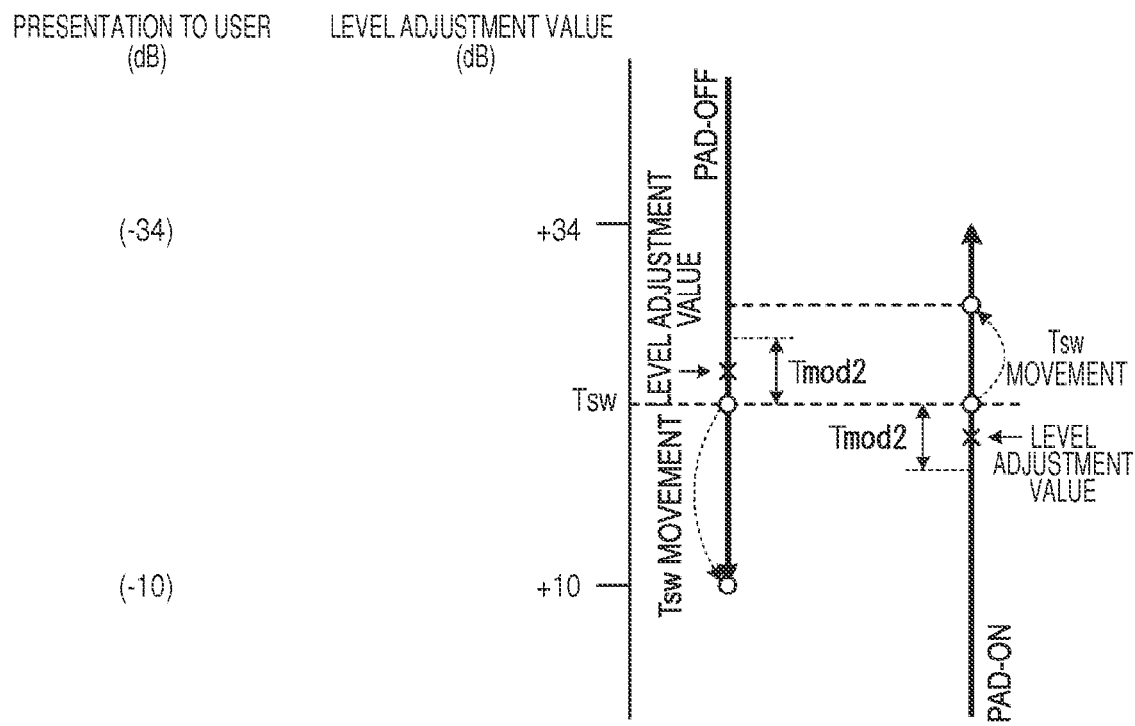
FIG. 12 is a diagram illustrating control in the second embodiment which is performed when the performance mode starts.

Next, control which is performed when the performance mode starts will be described with reference to FIG. 12.

In the second embodiment, for the same purpose as in the first embodiment, as the operation mode of the pad, two modes of the performance mode and the rehearsal mode are provided.

The digital mixer 10 has a near distance Tmod2 for determining near the switching point and regards the range from Tsw to Tmod2 as a near range. Specifically, as shown in FIG. 12, in the pad-off state, the range from Tsw to a value greater than Tsw by Tmod2 is set as a near range and, in the pad-on state, the range from Tsw to a value smaller than Tsw by Tmod2 is set as a near range.

It should suffice that Tmod2 is set to an appropriate value assuming the manipulation range of the level adjustment value. Tmod2 may be arbitrarily set by the user or may have a fixed value prepared in advance by the manufacturer.

Next, it is determined whether or not current data of the level adjustment value falls within the near range when the performance mode starts. When current data of the level adjustment value falls within the near range, Tsw is moved so as to be away from current data of the level adjustment value. Specifically, when current data of the level adjustment value is as indicated by a symbol × in FIG. 12, it is determined that current data of the level adjustment value is near Tsw and, as indicated by a symbol ○ and a broken-line arrow in FIG. 12, Tsw (symbol ○) is moved from the position at the end of the broken-line arrow to the position at the head of the broken-line arrow.

It should suffice that the movement amount of Tsw is set such that the distance between the level adjustment value and Tsw after movement is equal to or greater than Tmod2. The movement amount of Tsw may be arbitrarily set by the user or may have a fixed value prepared in advance by the manufacturer. As shown in FIG. 12, the movement amount of Tsw may differ between the pad-on state and the pad-off state or may be the same amount in the pad-on state and the pad-off state (the movement directions are opposite to each other). A configuration is made such that Tsw after movement is not out of the range (in FIG. 12, from +10 dB to +34 dB) which is shared by the settable range of the level adjustment value at the time of pad-off and the settable range of the level adjustment value at the time of pad-on.

Figure 13:
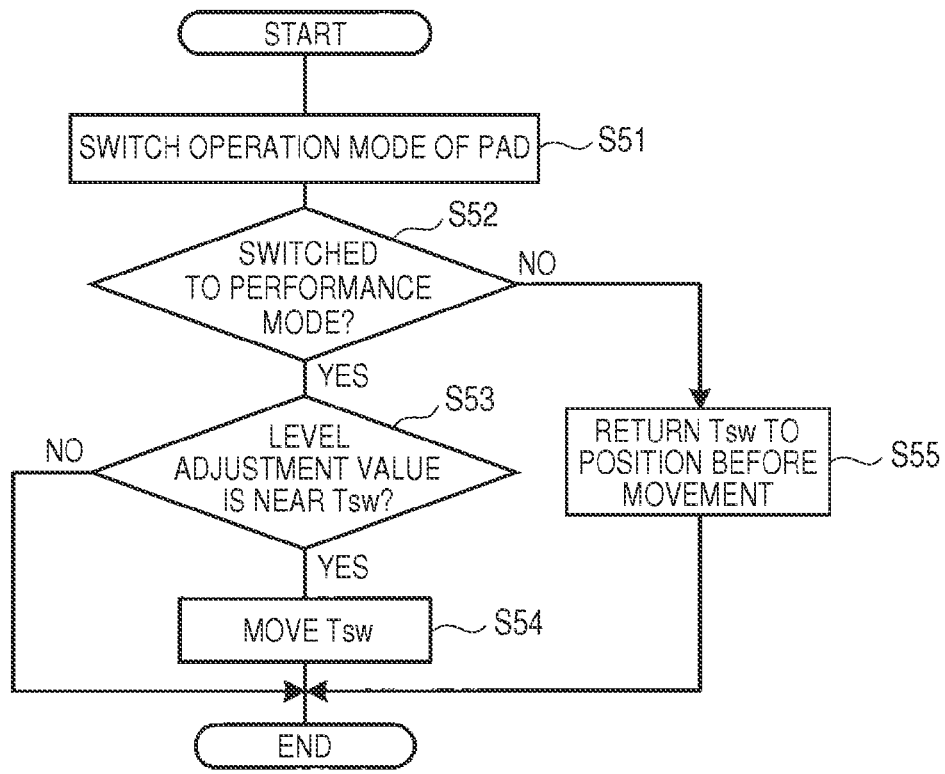
FIG. 13 is a flowchart of processing in the second embodiment which is performed when the CPU of the digital mixer changes an operation mode.

Next, FIG. 13 is a flowchart of processing which is performed by the CPU 11 to carry out the operation described with reference to FIG. 12. Similarly to the processing of FIG. 9, FIG. 13 shows processing which starts when an instruction is issued to switch the operation mode, that is, manipulation of the operation mode-switching switch provided as a portion of the manipulator 16 is detected.

The CPU 11 first inverts the operation mode of the pad (Step S51). Specifically, before manipulation of the operation mode-switching switch, if the operation mode is the performance mode, the operation mode is switched to the rehearsal mode and, if the operation mode is the rehearsal mode, the operation mode is switched to the performance mode. Next, it is confirmed whether or not the operation mode after switching is the performance mode (Step S52). When it is confirmed that the operation mode is the performance mode (YES in Step S52), it is determined whether or not current data of the level adjustment value is near Tsw, that is, whether or not the value of current data of the level adjustment value is within the near range from Tsw to Tmod2 as described with reference to FIG. 12 (Step S53).

When it is determined that current data of the level adjustment value is near Tsw (YES in Step S53), the value of Tsw is moved in accordance with a defined rule (is moved by a defined movement amount or is moved to a defined position) so as to be away from current data of the level adjustment value (Step S54). The initial value (value before movement) of Tsw is stored separately from current data of Tsw. After Step S54 ends, the processing of FIG. 13 ends.

When it is confirmed in Step S52 that the operation mode is the rehearsal mode not the performance mode (an instruction is issued to end the performance mode) (NO in Step S52), Tsw returns to the position before movement in Step S54, that is, the initial value (value before movement) stored in Step S54 is overwritten as current data of Tsw (Step S55).

When it is determined in Step S53 that current data of the level adjustment value is not near Tsw, after Step S54 ends or after Step S55 ends, the processing of FIG. 13 ends.

[Modifications]

Although the embodiments have been described, it should be understood that the configuration of the apparatus, the configuration of the manipulation means, the specific processing contents, the manipulation method, and the like are not limited to the above-described embodiments.

For example, a CPU may be provided in the waveform I/O 18, such that the CPU of the waveform I/O 18 performs the processing of FIGS. 6, 7, and 11.

A configuration may be made in which no rehearsal mode is provided, an instruction to start the performance mode is received, and when the instruction to start the performance mode is detected, the processing of FIG. 9 starts from Step S33 or the processing of FIG. 13 starts from Step S53.

The setting of the level adjustment amount or the switching of the operation mode may be done by using a remote controller, not the manipulator provided in the main body of the level adjustment device.

The level adjustment device may be applied to an arbitrary acoustic signal processing apparatus, to which an analog sound signal is input, such as a synthesizer, a recorder, an effecter, or an amplifier, in addition to the digital mixer. The level adjustment device may be applied to a personal computer, a mobile phone, a portable game machine, a television, or the like insofar as an analog sound signal is input.

The invention may be mounted in an acoustic signal processing apparatus or other apparatuses, or may be carried out as a single level adjustment device.

The above-described configuration and modifications may be appropriately applied in combination within a compatible range.

As will be apparent from the above description, according to the level adjustment device of the invention, it is possible to automatically switch the on/off of the pad and to prevent frequent occurrence of on/off switching of the pad even when the user carries out fine manipulation.

Therefore, if the level adjustment device is applied to an analog input section of an acoustic signal processing apparatus, such as a digital mixer, it is possible to adjust the level of an input signal with a simple manipulation, realizing a high-quality acoustic signal processing apparatus with little discontinuity of the input signal.

What is claimed is:

1. A method for attenuating an audio signal comprising:
   entering a first operation mode;
   determining that a first level adjustment value of a level adjustment parameter is within a range of a first switching point, the level adjustment parameter associated with a gain control controlling a gain level of the input channel for the audio signal, the input channel comprising a switchable attenuation pad and an amplifier;
   in response to said determining,
      transitioning a state of the switchable attenuation pad and
      determining a second switching point, wherein the second switching point is based on the state of the switchable attenuation pad after said transitioning, wherein the state of the switchable attenuation pad transitions when the level adjustment parameter has a level adjustment value that reaches or crosses the second switching point, and wherein the separation between the first level adjustment value and the second switching point is greater than the separation between the first level adjustment value and the first switching point;
   applying a variable gain level to the amplifier based on the level adjustment parameter and the state of the switchable attenuation pad; and
   entering a second operation mode, wherein the state of the switchable attenuation pad transitions during the second operation mode when the level adjustment parameter has a level adjustment value that reaches or crosses a second operation mode switching point.

2. The method of claim 1, wherein, when the state of the switchable attenuation pad is in a pad-off state, the attenuation pad is out of an audio signal path of the input channel to stop attenuating the audio signal; and
   wherein, when the state of the switchable attenuation pad is in a pad-on state, the attenuation pad is in the audio signal path to attenuate the audio signal.

3. A method for attenuating an audio signal comprising:
entering a first operation mode;
determining that a first level adjustment value of a level adjustment parameter is within a range of a first switching point, the level adjustment parameter associated with a gain control controlling a gain level of the input channel for the audio signal, the input channel comprising a switchable attenuation pad and an amplifier, wherein the first switching point is at a predetermined level:
in response to said determining, determining a second switching point, wherein a state of the switchable attenuation pad transitions when the level adjustment parameter has a level adjustment value that reaches or crosses the second switching point, and wherein the separation between the first level adjustment value and the second switching point is greater than the separation between the first level adjustment value and the first switching point, wherein the second switching point is at a level value different from the predetermined level value;
applying a variable gain level to the amplifier based on the level adjustment parameter and the state of the switchable attenuation pad;
entering a second operation mode; and
determining a third switching point, wherein the third switching point is at the predetermined level value.

4. The method of claim 3, wherein the state of the switchable attenuation pad transitions during the second operation mode when the level adjustment parameter has a level adjustment value that reaches or crosses the third switching point.

5. An attenuation system for an audio signal comprising:
an input channel for receiving an audio signal with a switchable attenuation pad and an amplifier;
a gain control having a level position for controlling a gain level of the input channel;
a switch for switching said attenuation pad in and out of an audio signal path,
an operation mode-switching switch for switching between a first operation mode and a second operation mode; and
a controller configurable for:
switching the attenuation system into the first operational mode in response to a first input at the operation mode-switching switch,
determining that a first level adjustment value of a level adjustment parameter is within a range of a first switching point, the level adjustment parameter associated with the gain control;
in response to said determining,
transitioning a state of the switchable attenuation pad and
determining a second switching point, wherein the second switching point is based on the state of the switchable attenuation pad after said transitioning, wherein the state of the switchable attenuation pad transitions when the level adjustment parameter has a level adjustment value that reaches or crosses the second switching point, and wherein the separation between the first level adjustment value and the second switching point is greater than the separation between the first level adjustment value and the first switching point;
applying a variable gain level to the amplifier based on the level adjustment parameter and the state of the switchable attenuation pad and
switching the attenuation system into the second operation mode in response to a second input at the operation mode-switching switch, wherein the state of the switchable attenuation pad transitions during the second operation mode when the level adjustment parameter has a level adjustment value that reaches or crosses a second operation mode switching point.

6. The attenuation system of claim 5, wherein, when the state of the switchable attenuation pad is in a pad-off state, the attenuation pad is out of an audio signal path of the input channel to stop attenuating the audio signal; and
wherein, when the state of the switchable attenuation pad is in a pad-on state, the attenuation pad is in the audio signal path to attenuate the audio signal.

7. An attenuation system for an audio signal comprising:
an input channel for receiving an audio signal with a switchable attenuation pad and an amplifier;
a gain control having a level position for controlling a gain level of the input channel;
a switch for switching said attenuation pad in and out of an audio signal path,
an operation mode-switching switch for switching between a first operation mode and a second operation mode; and
a controller configurable for:
switching the attenuation system into the first operational mode in response to a first input at the operation mode-switching switch,
determining that a first level adjustment value of a level adjustment parameter is within a range of a first switching point, the level adjustment parameter associated with the gain control, wherein the first switching point is at a predetermined level value;
in response to said determining, determining a second switching point, wherein the state of the switchable attenuation pad transitions when the level adjustment parameter has a level adjustment value that reaches or crosses the second switching point, and wherein the separation between the first level adjustment value and the second switching point is greater than the separation between the first level adjustment value and the first switching point, wherein the second switching point is at a level value different from the predetermined level value;
switching the attenuation system into the second operation mode in response to a second input at the operation mode-switching switch; and
determining a third switching point, wherein the third switching point is at the predetermined level value.

8. The attenuation system of claim 7, wherein the state of the switchable attenuation pad transitions during the second operation mode when the level adjustment parameter has a level adjustment value that reaches or crosses the third switching point.

9. The attenuation system of claim 7, wherein, when the state of the switchable attenuation pad is in a pad-off state, the attenuation pad is out of an audio signal path of the input channel to stop attenuating the audio signal; and
wherein, when the state of the switchable attenuation pad is in a pad-on state, the attenuation pad is in the audio signal path to attenuate the audio signal.

10. The method of claim 3, wherein, when the state of the switchable attenuation pad is in a pad-off state, the attenuation pad is out of an audio signal path of the input channel to stop attenuating the audio signal; and
wherein, when the state of the switchable attenuation pad is in a pad-on state, the attenuation pad is in the audio signal path to attenuate the audio signal.

* * * * *